United States Patent
Saito

(10) Patent No.: US 6,483,021 B2
(45) Date of Patent: *Nov. 19, 2002

(54) STACKED PHOTOVOLTAIC ELEMENT

(75) Inventor: Keishi Saito, Nara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,259

(22) Filed: Feb. 25, 1999

(65) Prior Publication Data

US 2002/0011264 A1 Jan. 31, 2002

(30) Foreign Application Priority Data

Feb. 26, 1998 (JP) .......................... 10-045082

(51) Int. Cl.⁷ ............................... H01L 31/00
(52) U.S. Cl. ..................................... 136/258
(58) Field of Search .......................... 136/258

(56) References Cited

U.S. PATENT DOCUMENTS

| | | | |
|---|---|---|---|
| 4,064,521 A | 12/1977 | Carlson | ............ 357/2 |
| 5,298,086 A | 3/1994 | Guha et al. | ........ 136/249 |
| 5,677,236 A | * 10/1997 | Saitoh et al. | ........ 136/258 |
| 5,913,986 A | * 6/1999 | Matsuyama | ........ 136/255 |

* cited by examiner

*Primary Examiner*—Mark Chapman
(74) *Attorney, Agent, or Firm*—Fitzpatrick, Cella, Harper & Scinto

(57) ABSTRACT

The present invention provides a stacked photovoltaic element formed by stacking, on a substrate, at least a pin junction constituent element having a microcrystalline semiconductor in an i-type semiconductor layer and a pin junction constituent element having an amorphous semiconductor in an i-type semiconductor layer, wherein a current is controlled by the pin junction constituent element having the microcrystalline semiconductor in the i-type semiconductor layer, thereby obtaining a stacked photovoltaic element with a high photoelectric conversion efficiency and a reduced variation in the photoelectric conversion efficiency for a long light irradiation time.

4 Claims, 2 Drawing Sheets

STACKED PHOTOVOLTAIC ELEMENT

BACKGROUND OF THE INVENTION

1. Field of the Invention

The present invention relates to a photovoltaic element such as a solar cell, and more particularly to a stacked photovoltaic element in which a plurality of pin junction constituent elements are stacked.

2. Related Background Art

Technology relating to the thin film photovoltaic element is disclosed for example in the U.S. Pat. No. 4,064,521. However it does not teach at all the configuration capable of improving and stabilizing the photoelectric conversion efficiency.

Also, with regard to the configuration of the stacked photovoltaic element, the U.S. Pat. No. 5,298,086 discloses a method of not degrading the fill factor (FF) of the photovoltaic element. More specifically, the above-mentioned patent discloses a method of forming a thinner semiconductor layer of satisfactory film quality and controlling the current of the stacked photovoltaic element by the thin constituent element of satisfactory film quality.

However, the method disclosed in the U.S. Pat. No. 5,298,086 is not sufficient for maximizing the photoelectric conversion efficiency of the stacked photovoltaic element and maintaining stability for a long light irradiation time. In particular, this method is unable to achieve a high photoelectric conversion efficiency and sufficient stability in case the i-type semiconductor layer (hereinafter, referred to as "i-type layer") of the first pin junction constituent element of the stacked photovoltaic element is composed of a microcrystalline semiconductor and the i-type layer of the second pin junction constituent element is composed of an amorphous semiconductor.

SUMMARY OF THE INVENTION

The object of the present invention is to provide a stacked photovoltaic element employing a microcrystalline semiconductor in the i-type layer of the first pin junction constituent element and an amorphous semiconductor in the i-type layer of the second pin junction constituent element, and having a high photoelectric conversion efficiency and a less variation in the photoelectric conversion efficiency for a long light irradiation time.

In order to attain the above-mentioned object, the stacked photovoltaic element of the present invention is formed by stacking on a supporting member, at least a pin junction constituent element having a microcrystalline semiconductor in an i-type layer and a pin junction constituent element having an amorphous semiconductor in an i-type layer, wherein the current is controlled by the pin junction constituent element having a microcrystalline semiconductor in the i-type layer.

In the above-mentioned configuration, the short circuit current of the pin junction constituent element having a microcrystalline semiconductor in the i-type layer is preferably set to a value smaller than that of the pin junction constituent element having an amorphous semiconductor in the i-type layer.

Also, the average crystal grain size of the i-type layer composed of a microcrystalline semiconductor is preferably within a range of 100 Å to 1000 Å.

Also, the i-type layer composed of a microcrystalline semiconductor preferably has a columnar crystalline structure.

Furthermore, the band gap of the i-type layer composed of a microcrystalline semiconductor is preferably set so as to become wider toward the interfaces between a p-type semiconductor layer (hereinafter referred to as "p-type layer") and the i-type layer and between an n-type semiconductor layer (hereinafter referred to as "n-type layer") and the i-type layer.

DETAILED DESCRIPTION OF THE PREFERRED EMBODIMENTS

Figure 1:
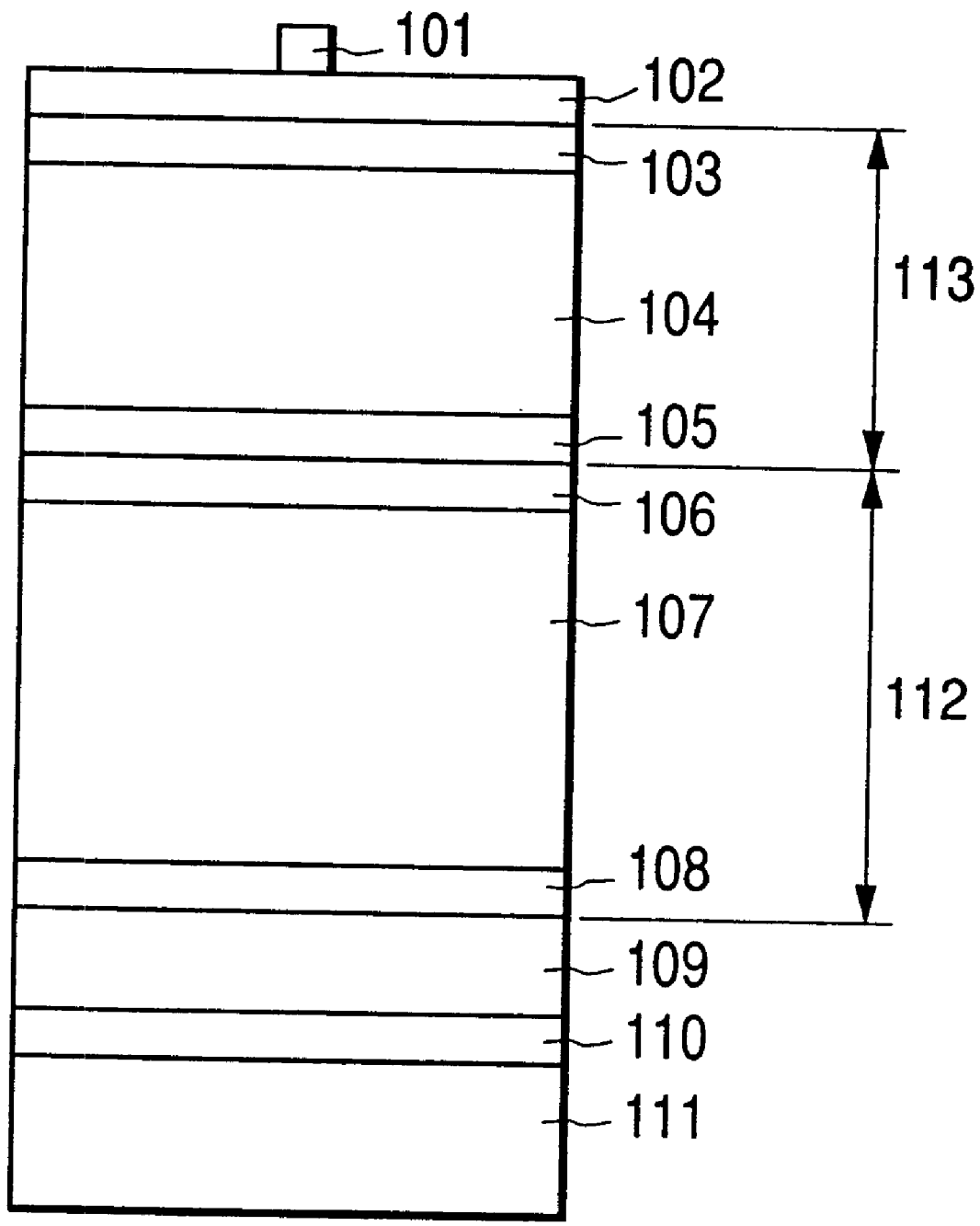
FIG. 1 is a schematic cross-sectional view showing an example of the layered structure of the stacked photovoltaic element of the present invention.

The present invention relates to a novel stacked photovoltaic element as explained in the foregoing, and the effects of the present invention will be explained in the following.

For maximizing the photoelectric conversion efficiency, the stacked photovoltaic element has to be designed in consideration not only of the initial characteristics of the constituent elements but also of the degradation thereof for a long light irradiation time. For example, in the conventional stacked photovoltaic element employing only an amorphous silicon based semiconductor, it has been difficult to obtain a design capable of maximizing the electric power generated for a long light irradiation time, because of a significant degradation of the characteristics for a long light irradiation time and a large difference between the initial characteristics and those after degradation.

The stacked photovoltaic element of the present invention is formed by stacking a photovoltaic element employing a microcrystalline silicon semiconductor in the i-type layer and a photovoltaic element employing an amorphous silicon semiconductor in the i-type layer. The microcrystalline silicon semiconductor shows little variation in the characteristics under light irradiation for a long time. On the other hand, the amorphous silicon semiconductor shows, as already known, a large degradation in the characteristics for a long light irradiation time. The present invention solves the above-mentioned drawback by employing a combination of a microcrystalline silicon semiconductor which is free from degradation by light and an amorphous silicon semiconductor.

The conventional stacked photovoltaic element employing an amorphous silicon semiconductor in the i-type layer has generally been designed so that the currents of the constituent elements become mutually equal under light irradiation. Also in case the i-type layer at the light incident side has the smallest deposition rate, the thickness of each layer is adjusted so that the photocurrent of the i-type layer becomes smallest.

However, such designing principle is unable to optimize the design of the stacked photovoltaic element utilizing the photovoltaic element employing a microcrystalline silicon semiconductor in the i-type layer and the photovoltaic element employing an amorphous silicon semiconductor in the i-type layer.

The microcrystalline silicon semiconductor employed in the present invention does not show degradation of the characteristics even for a long light irradiation time, differently from amorphous silicon semiconductor. Therefore, the stacked photovoltaic element designed according to the above-mentioned principle shows large degradation of the characteristics with the lapse of time, because the amorphous silicon photovoltaic element constituting a controlling factor is degraded by light irradiation for a long time.

Based on an intensive investigation on this aspect, the present inventor has found that the degradation of the characteristics for a long light irradiation time can be significantly reduced by employing a pin junction constituent element having the i-type layer composed of a microcrystalline silicon semiconductor which is substantially free from degradation by light, as the current-controlling element of the stacked photovoltaic element.

In the following there will be explained the embodiments of the stacked photovoltaic element of the present invention, but the present invention is by no means limited to such embodiments.

Now the present invention will be explained in detail with reference to FIG. 1 and Tables 1(a) to 1(c) through 4(a) and 4(b). FIG. 1 is a schematic cross-sectional view showing an example of the layered structure of the stacked photovoltaic element of the present invention.

The stacked photovoltaic element shown in FIG. 1 is formed by stacking in succession, on a supporting member 111 such as a metallic substrate composed for example of stainless steel or an insulating substrate composed for example of glass, a reflective layer 110 composed for example of Al, Cu or Ag; a reflection increasing layer 109 composed for example of zinc oxide, indium oxide or tin oxide; a bottom photovoltaic element 112 consisting of an n- or p-type layer 108, an i-type layer 107, a p- or n-type layer 106; a top photovoltaic element 113 consisting of an n- or p-type layer 105, an i-type layer 104 and a p- or n-type layer 103; a transparent electrode 102 composed for example of ITO; and a current-collecting electrode 101. In this photovoltaic element, the i-type layer 107 of the bottom photovoltaic element 112 is composed of a microcrystalline silicon semiconductor, and the i-type layer 104 of the top photovoltaic element 113 is composed of an amorphous semiconductor.

Tables 1(a) to 1(c) through 4(a) and 4(b) show the variation of the photoelectric conversion efficiency of the stacked photovoltaic element (hereinafter, referred to as "double") when the short circuit photocurrents of the top photovoltaic element (hereinafter, referred to as "top") and the bottom photovoltaic element (hereinafter, referred to as "bottom") are changed and photodegraded. In the stacked photovoltaic element, the photodegradation mainly takes place in the top photovoltaic element but not in the bottom photovoltaic element. In these tables, Voc means an open circuit voltage Voc; Jsc, a short circuit photocurrent; FF a fill factor; and EFF, a photoelectric conversion efficiency. Tables 1(a), 2(a), 3(a) and 4(a) show the initial characteristics, while other tables show the characteristics after degradation by irradiation with light of AM1.5, 100 mW. Namely, Tables 1(b), 2(b) and 3(b) show the characteristics after light irradiation for 100 hours, and Tables 1(c), 2(c), 3(c) and 4(b) show the characteristics after light irradiation for 1000 hours.

TABLE 1(a)

|  | Voc (V) | Jsc (mA/cm$^2$) | FF | EFF (%) | Efficiency ratio |
|---|---|---|---|---|---|
| Top | 0.95 | 11.0 | 0.700 | 7.32 |  |
| Bottom | 0.48 | 11.0 | 0.660 | 3.48 |  |
| Double | 1.43 | 11.0 | 0.677 | 10.65 | 1 |

TABLE 1(b)

|  | Voc (V) | Jsc (mA/cm$^2$) | FF | EFF (%) | Efficiency ratio |
|---|---|---|---|---|---|
| Top | 0.95 | 11.0 | 0.650 | 6.79 |  |
| Bottom | 0.48 | 11.0 | 0.660 | 3.48 |  |
| Double | 1.43 | 11.0 | 0.644 | 10.13 | 0.951 |

TABLE 1(c)

|  | Voc (V) | Jsc (mA/cm$^2$) | FF | EFF (%) | Efficiency ratio |
|---|---|---|---|---|---|
| Top | 0.95 | 11.0 | 0.600 | 6.27 |  |
| Bottom | 0.48 | 11.0 | 0.660 | 3.48 |  |
| Double | 1.43 | 11.0 | 0.610 | 9.60 | 0.901 |

Tables 1(a) to 1(c) show a case where the top photovoltaic element and the bottom photovoltaic element have a same short circuit photocurrent.

TABLE 2(a)

|  | Voc (V) | Jsc (mA/cm$^2$) | FF | EFF (%) | Efficiency ratio |
|---|---|---|---|---|---|
| Top | 0.95 | 11.0 | 0.700 | 7.32 |  |
| Bottom | 0.48 | 12.0 | 0.660 | 3.80 |  |
| Double | 1.43 | 11.0 | 0.695 | 10.93 | 1 |

TABLE 2(b)

|  | Voc (V) | Jsc (mA/cm$^2$) | FF | EFF (%) | Efficiency ratio |
|---|---|---|---|---|---|
| Top | 0.95 | 11.0 | 0.650 | 6.79 |  |
| Bottom | 0.48 | 12.0 | 0.660 | 3.80 |  |
| Double | 1.43 | 11.0 | 0.659 | 10.37 | 0.948 |

TABLE 2(c)

|  | Voc (V) | Jsc (mA/cm$^2$) | FF | EFF (%) | Efficiency ratio |
|---|---|---|---|---|---|
| Top | 0.95 | 11.0 | 0.600 | 6.27 |  |
| Bottom | 0.48 | 12.0 | 0.660 | 3.80 |  |
| Double | 1.43 | 11.0 | 0.623 | 9.80 | 0.896 |

Tables 2(a) to 2(c) show a case where the short circuit photocurrent of the top photovoltaic element is smaller than that of the bottom photovoltaic element.

TABLE 3(a)

| | Voc (V) | Jsc (mA/cm$^2$) | FF | EFF (%) | Efficiency ratio |
|---|---|---|---|---|---|
| Top | 0.95 | 12.0 | 0.700 | 7.98 | |
| Bottom | 0.48 | 11.0 | 0.660 | 3.48 | |
| Double | 1.43 | 11.0 | 0.709 | 11.15 | 1 |

TABLE 3(b)

| | Voc (V) | Jsc (mA/cm$^2$) | FF | EFF (%) | Efficiency ratio |
|---|---|---|---|---|---|
| Top | 0.95 | 12.0 | 0.650 | 7.41 | |
| Bottom | 0.48 | 11.0 | 0.660 | 3.48 | |
| Double | 1.43 | 11.0 | 0.679 | 10.68 | 0.958 |

TABLE 3(c)

| | Voc (V) | Jsc (mA/cm$^2$) | FF | EFF (%) | Efficiency ratio |
|---|---|---|---|---|---|
| Top | 0.95 | 12.0 | 0.600 | 6.84 | |
| Bottom | 0.48 | 11.0 | 0.660 | 3.48 | |
| Double | 1.43 | 11.0 | 0.646 | 10.16 | 0.911 |

Tables 3(a) to 3(c) show a case where the short circuit photocurrent of the top photovoltaic element is larger than that of the bottom photovoltaic element.

TABLE 4(a)

| | Voc (V) | Jsc (mA/cm$^2$) | FF | EFF (%) | Efficiency ratio |
|---|---|---|---|---|---|
| Top | 0.95 | 14.0 | 0.700 | 9.31 | |
| Bottom | 0.48 | 11.0 | 0.660 | 3.48 | |
| Double | 1.43 | 11.0 | 0.744 | 11.70 | 1 |

TABLE 4(b)

| | Voc (V) | Jsc (mA/cm$^2$) | FF | EFF (%) | Efficiency ratio |
|---|---|---|---|---|---|
| Top | 0.95 | 14.0 | 0.600 | 7.98 | |
| Bottom | 0.48 | 11.0 | 0.660 | 3.48 | |
| Double | 1.43 | 11.0 | 0.693 | 10.90 | 0.931 |

Tables 4(a) and 4(b) show a case where the short circuit photocurrent of the top photovoltaic element is extremely larger than that of the bottom photovoltaic element.

Comparison of the foregoing four cases clearly indicates that the photoelectric conversion efficiency of the stacked photovoltaic element becomes higher with a larger short circuit photocurrent of the top photovoltaic element, in case of generating the photodegradation of the top photovoltaic element.

As explained in the foregoing, in the stacked photovoltaic element in which the photovoltaic element employing a microcrystalline silicon semiconductor in the i-type layer (bottom photovoltaic element in the above-described cases) and the photovoltaic element employing an amorphous silicon semiconductor in the i-type layer (top photovoltaic element in the above-described cases), a stable photoelectric conversion efficiency over a long time can be obtained by designing the stacked photovoltaic element in such a manner that the photocurrent thereof is controlled by the current of the photovoltaic element having the i-type layer composed of a microcrystalline silicon semiconductor which is substantially free from photodegradation.

The short circuit photocurrent of each constituent element of the stacked photovoltaic element can be measured from the spectral sensitivity characteristics of the photovoltaic element. For example, in a double-structured photovoltaic element obtained by stacking two pin junction photovoltaic elements, the short circuit currents of the top and bottom photovoltaic elements are determined in the following manner.

The short circuit photocurrent of the top photovoltaic element is determined by applying, to the stacked photovoltaic element, a forward bias corresponding to the photovoltage of the bottom photovoltaic element under light irradiation whose wavelength region is mainly absorbed in the bottom photovoltaic element, then irradiating the top photovoltaic element of the stacked photovoltaic element in this state to measure the spectral sensitivity characteristics, and convoluting thus measured spectral sensitivity characteristics with the spectral intensity of the solar light to calculate the current of the top photovoltaic element.

Also the short circuit photocurrent of the bottom photovoltaic element is determined by irradiating the top photovoltaic element with light mainly absorbed in the top photovoltaic element, applying a forward corresponding to the photovoltage of the top photovoltaic element, then measuring the spectral sensitivity characteristics in this state similarly to the case of the top photovoltaic element, and convoluting thus measured spectral sensitivity characteristics with the spectral intensity of the solar light to calculate the current of the bottom photovoltaic element.

The present invention can apply not only to the photovoltaic element having the above-described double structure of a stacking two pin junction photovoltaic elements, but also to the photovoltaic element having a multiple structure of stacking of three or more pin junction photovoltaic elements.

Figure 2:
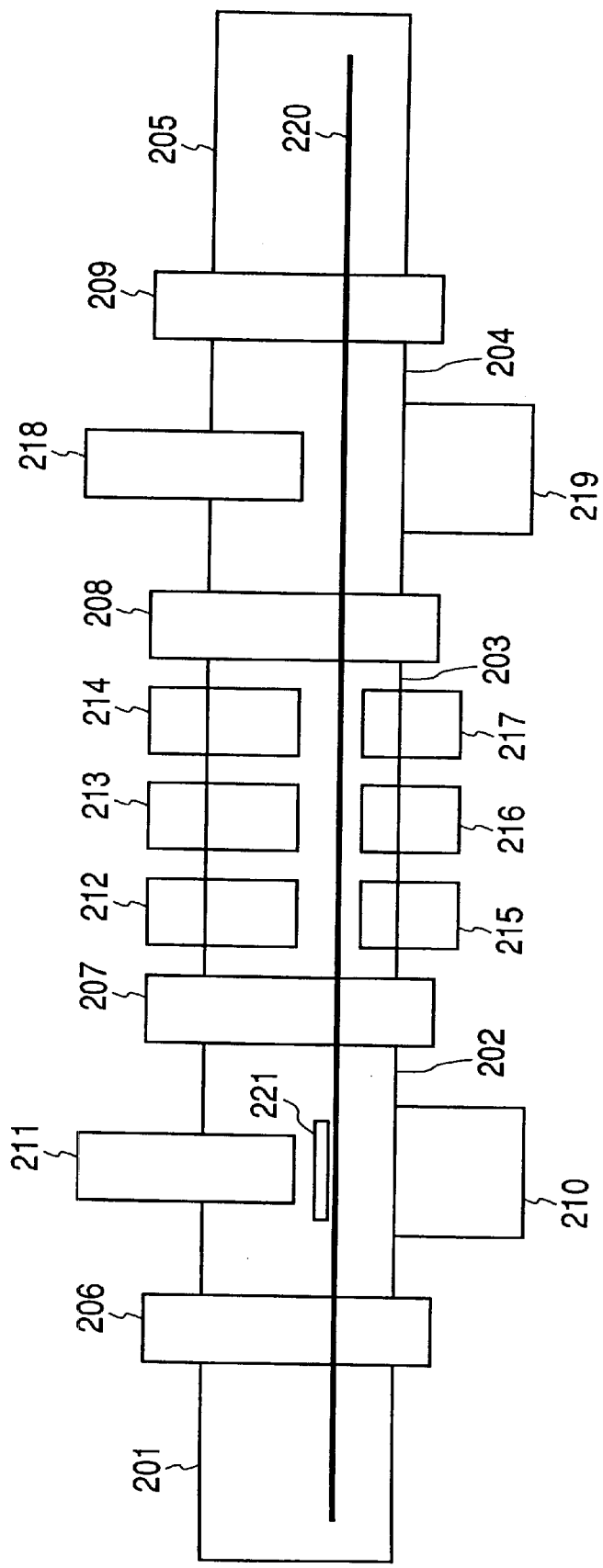
FIG. 2 is a schematic cross-sectional view showing an example of a deposited film forming apparatus for forming the stacked photovoltaic element of the present invention.

FIG. 2 is a schematic cross-sectional view showing an example of a deposited film forming apparatus for producing the stacked photovoltaic element of the present invention. Referring to FIG. 2, the deposited film forming apparatus is mainly composed of a load chamber 201, a chamber 202 for depositing a microcrystalline silicon i-type layer, an RF chamber 203 for depositing an amorphous silicon i-type, p-type or n-type layer, a chamber 204 for depositing a microcrystalline silicon germanium i-type layer, and an unload chamber 220. These chambers are mutually separated by gate valves 206, 207, 208 and 209 in order that the raw material gasses are not mutually mixed.

The chamber 202 for depositing the microcrystalline silicon i-type layer is provided with a heater 211 for heating the substrate and a plasma CVD chamber 210. The RF chamber 203 is provided with aa heater 212 for depositing an n-type layer, a chamber 215 for depositing an n-type layer, a heater 213 for depositing an i-type layer, a chamber 216 for depositing an i-type layer, a heater 214 for depositing a p-type layer, and a chamber 217 for depositing a p-type layer. The chamber 204 for depositing the microcrystalline silicon germanium i-type layer is provided with a heater 218 and a plasma CVD chamber 219.

The substrate is mounted on a substrate holder 221 and moves on a rail 220 by externally driven rollers.

The plasma CVD chambers 210 and 219 are used for depositing microcrystals. The deposition of microcrystals is executed by microwave plasma CVD or VHF plasma CVD.

The stacked photovoltaic element of the present invention is formed by using the above-described deposited film forming apparatus, for example, in the following manner. At first, a stainless steel substrate is set on the substrate holder 221, which is then set on the rail 220 of the load chamber 201. Then the interior of the load chamber 201 is evacuated to a vacuum level of several mTorr or less.

Then the gate valves 206 and 207 are opened and the substrate holder 221 is moved to the n-type layer depositing chamber 215 of the chamber 203. Then the gate valves 206 and 207 are closed, and the substrate is heated to a desired temperature by the heater 212 and an n-type layer is deposited in a desired thickness with desired raw material gases. After sufficient evacuation, the gate valve 207 is opened, then the substrate holder 221 is moved to the depositing chamber 202 and the gate valve 207 is closed.

The substrate is heated by the heater 211 to a desired substrate temperature, then necessary amounts of desired raw material gases are introduced at a desired vacuum level, predetermined microwave or VHF energy is introduced into the plasma CVD chamber 210 to generate plasma, thereby depositing a microcrystalline silicon i-type layer in a desired thickness. After the chamber 202 is sufficiently evacuated, the gate valve 207 is opened, then the substrate holder 221 is moved from the chamber 220 to the chamber 203 and the gate valve 207 is closed.

The substrate holder 221 is moved to the p-type layer depositing chamber 217 of the chamber 203 and the substrate is heated to a desired temperature by the heater 214. Raw material gases for p-type layer deposition are introduced at a desired flow rate into the depositing chamber 217, and while maintaining the chamber 217, at a desired vacuum level, RF energy is introduced into the deposition chamber 217 to deposit a p-type layer in a desired thickness.

After the deposition of the p-type layer, the interior of the depositing chamber 217 is sufficiently evacuated, and the substrate holder 221 is moved to the n-type layer depositing chamber 215 in the same chamber 203. An n-type layer is deposited on the p-type layer, in the same manner as in the case of depositing the foregoing i-type layer. The interior of the depositing chamber 215 is sufficiently evacuated, and the substrate holder is moved to the i-type layer depositing chamber 216.

The substrate is heated to a desired temperature by the heater 213, and raw material gases for depositing the i-type layer is introduced at a desired flow rate into the depositing chamber 216, and while maintaining the chamber 216 at a desired vacuum level, desired RF energy is introduced. Then the interior of the depositing chamber 216 is sufficiently evacuated, then the substrate holder 221 is moved from the depositing chamber 216 to the depositing chamber 217, and a p-type layer is deposited on the i-type layer in the same as in the case of depositing the above-described p-type layer. After the interior of the depositing chamber 217 is sufficiently evacuated as explained in the foregoing, the gate valves 208 and 209 are opened and the substrate holder 221 holding the substrate with deposited semiconductor layers is moved to the unload chamber 205.

All the gate valves are closed and nitrogen gas is introduced into the unload chamber 205 to cool the substrate to a desired temperature. Subsequently, the substrate holder 221 is taken out by opening the take-out valve of the unload chamber 205.

Then, an evaporator (not shown in the drawings) for depositing a transparent electrode is used to deposit a transparent electrode with a desired thickness on the p-type layer. Similarly, a current collecting electrode is deposited on the transparent electrode.

In the following there will be given a detailed explanation on the constituents of the stacked photovoltaic element of the present invention.

[Substrate (Supporting Member), Reflective Layer]

The substrate to be employed in the stacked photovoltaic element of the present invention is advantageously composed of a metallic substrate such as stainless steel, particularly ferrite based stainless steel. Also glass and ceramics are suitable as an insulating substrate.

In case of the insulating substrate, it is necessary to apply a conductive treatment thereto, for example by depositing a metal or a transparent conductive film on such insulating substrate. In case a photovoltaic element is formed by employing a light-transmissive substrate such as glass and depositing a transparent conductive film thereon, light may be introduced not only from the side of the semiconductor layers but also from the side of the light-transmissive substrate.

The conductive treatment can be achieved by depositing a metal such as Al, Ag or Cu or an alloy thereof as a reflective layer. Thus the reflective layer can also function as an electrode layer. The reflective layer has to be deposited at least with a thickness providing the reflectivity of the metal itself.

In order to form the reflective layer with a surface as flat as possible, it is preferably formed with a thickness of several hundred Å to 3000 Å at a relatively low temperature. Also, in order to form a reflective layer with an irregular surface, it is preferably obtained with a thickness larger than 3000 Å but less than several micrometers.

[Reflection Increasing Layer]

In order to increase the light amount absorbed in the semiconductor layers, a reflection increasing layer is desirably formed on the metallic substrate or the reflective layer mentioned above. The reflection increasing layer is advantageously composed of an oxide such as indium oxide, tin oxide or zinc oxide. The thickness of the reflection increasing layer is optimally within a range of 1000 Å to 50000 Å.

[P-type Layer, n-type Layer]

The p-type or n-type layer is an important layer controlling the characteristics of the photovoltaic element. Examples of the amorphous, microcrystalline or polycrystalline material constituting the p-type or n-type layer include a-Si:H ("a-" means amorphous), a-Si:HX, a-SiC:H, a-SiC:HX, a-SiGe:H, a-SiGeC:H, a-SiO:H, a-SiN:H, a-SiON:HX, a-SiOCN:HX, $\mu$c-Si:H ("$\mu$c-" means microcrystalline), $\mu$c-SiC:H, $\mu$c-Si:HX, $\mu$c-SiC:HX, $\mu$c-SiGe:H, $\mu$c-SiO:H, $\mu$c-SiGeC:H, $\mu$c-SiN:H, $\mu$c-SiON:HX, $\mu$c-SiOCN:HX, poly-Si:H ("poly-" means polycrystalline), poly-SiHX, poly-SiC:H, poly-SiC:HX, poly-SiGe:H, poly-Si, poly-SiC and poly-SiGe (wherein X indicates a halogen atom) containing a p-type valence electron controlling material (element B, Al, Ga, In or Tl of the group III of the periodic table) or an n-type valence electron controlling material (element P, As, Sb or Bi of the group V of the periodic table) at a high concentration.

In particular, the p-type or n-type layer at the light incident side is advantageously composed of a crystalline semiconductor layer of little light absorption or an amorphous semiconductor layer of a wide band gap.

The amount of addition of the element of the group III of the periodic table to the p-type layer or of that of the group V of the periodic table to the n-type layer is optimally within a range of 0.1 to 50 atomic %.

Also the hydrogen atoms (H, D) or the halogen atoms contained in the p-type or n-type layer compensate the dangling bonds therein, thereby improving the doping efficiency of the p-type or n-type layer. The amount of addition of the hydrogen or halogen atoms to the p-type or n-type layer is optimally within a range of 0.1 to 40 atomic %. Particularly in case the p-type or n-type layer is crystalline, the optimum amount of hydrogen or halogen atoms is within a range of 0.1 to 8 atomic %.

In a preferred form of distribution, the content of hydrogen and/or halogen atoms is higher at the side of interfaces between the p-type layer and the i-type layer interface and between the n-type layer and the i-type layer, and the content of hydrogen and/or halogen atoms in the vicinity of the interfaces is preferably within a range of 1.1 to 2 times of the content in the bulk portion. Such higher content of hydrogen and/or halogen atoms in the vicinity of the p-type/i-type and n-type/i-type interfaces reduces the defect levels and mechanical strain in the vicinity of such interfaces, thereby increasing the photoelectromotive force or the photocurrent of the stacked photovoltaic element of the present invention.

With respect to the electrical characteristics of the p-type and n-type layers of the photovoltaic element, the activation energy is preferably not exceeding 0.2 eV, most preferably not exceeding 0.1 eV. Also the specific resistivity is preferably 100 Ωcm or lower, most preferably 1 Ωcm or lower. Also the thickness of the p-type or n-type layer is preferably within a range of 1 to 50 nm, most preferably 3 to 10 nm.

The raw material gas suitable for depositing the p-type or n-type layer of the photovoltaic element is, for example, a gasifiable silicon-containing compound, a gasifiable germanium-containing compound, a gasifiable carbon-containing compound or a mixture thereof.

Examples of the gasifiable silicon-containing compound include $SiH_4$, $SiH_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, and the like.

Examples of the gasifiable germanium-containing compound include $GeH_4$, $GeD_4$, $GeF_4$, $GeFH_3$, $GeF_2H_2$, $GeF_3H$, $GeHD_3$, $GeH_2D_2$, $GeH_3D$, $GeH_6$, $GeD_6$, and the like.

Examples of the gasifiable carbon-containing compound include $CH_4$, $CD_4$, $C_nH_{2n+2}$ (n being an integer), $C_nH_{2n}$ (n being an integer), $C_2H_2$, $C_6H_6$, $CO_2$, $CO$, and the like.

Examples of nitrogen-containing compound include $N_2$, $NH_3$, $ND_3$, $NO$, $NO_2$, $N_2O$, and the like.

Examples of oxygen-containing compound include $O_2$, $CO$, $CO_2$, $NO$, $NO_2$, $N_2O$, $CH_3CH_2OH$, $CH_3OH$, and the like.

The material introduced into the p-type or n-type layer for valence electron control can be atoms of the group III or V of the periodic table.

As the starting material effectively usable for introducing the atoms of the group III, the starting material for introducing boron atoms includes a boron hydride such as $B_2H_6$, $B_4H_{10}$, $B_5H_9$, $B_5H_{11}$, $B_6H_{11}$, $B_6H_{12}$ or $B_6H_{14}$, or a boron halide such as $BF_3$ or $BCl_3$, and the other materials include $AlCl_3$, $GaCl_3$, $InCl_3$ or $TlCl_3$. Particularly, $B_2H_6$ and $BF_3$ are preferred among these materials.

As the starting material effectively usable for introducing the atoms of the group V, the starting material for introducing phosphor atoms includes a phosphor hydride such as $PH_3$ or $P_2H_4$, or a phosphor halide such as $PH_4I$, $PF_3$, $PF_5$, $PCl_3$, $PCl_5$, $PBr_3$, $PBr_5$ or $PI_3$, and the other materials include $AsH_3$, $AsF_3$, $AsCl_3$, $AsBr_3$, $AsF_5$, $SbH_3$, $SbF_3$, $SbF_5$, $SbCl_3$, $SbCl_1$, $BiH_3$, $BiCl_3$ or $BiBr_3$. Particularly, $PH_3$ and $PF_3$ are preferred among these materials.

The p-type or n-type layer adapted for use in the photovoltaic element can be deposited by RF plasma CVD, VHF plasma CVD or microwave plasma CVD. In case of deposition by RF plasma CVD, particularly preferred is the capacitance-coupled RF plasma CVD. The optimum conditions for depositing the p-type or n-type layer by the RF plasma CVD include a substrate temperature of 100 to 350° C. in the depositing chamber, an internal pressure of 0.1 to 10 Torr, an RF power of 0.01 to 5.0 W/cm² and a deposition rate of 0.1 to 30 A/sec.

Also the above-mentioned gasifiable compound may be introduced into the depositing chamber with a suitable dilution gas such as $H_2$, He, Ne, Ar, Xe or Kr.

Particularly in case of depositing a microcrystalline semiconductor or a layer with little light absorption or with a wide band gap such as a-SiC:H, it is preferred to dilute the raw material gas 2 to 100 times with hydrogen gas and to introduce a relatively high RF or VHF power. The RF frequency is suitably within a range of 1 MHz to 300 MHz, most preferably in the vicinity of 13.56 MHz.

In case of depositing the p-type or n-type layer with microwave plasma CVD, the microwave is preferably introduced by a wave guide into the depositing chamber of the microwave plasma CVD apparatus through a window of a dielectric material (such as alumina ceramics). In case of depositing the p-type or n-type layer with microwave plasma CVD, the deposited film forming method of the present invention can be adopted but a deposited film adapted for use in the photovoltaic element can be obtained in winder depositing conditions.

The optimum conditions for depositing the p-type or n-type layer by the microwave plasma CVD include a substrate temperature of 100 to 400° C. in the depositing chamber, an internal pressure of 0.5 to 30 mTorr, a microwave power of 0.01 to 1 W/cm² and a microwave frequency of 0.5 to 10 GHz.

Also the above-mentioned gasifiable compound may be introduced into the depositing chamber with a suitable dilution gas such as $H_2$, He, Ne, Ar, Xe or Kr.

Particularly in case of depositing a microcrystalline semiconductor or a layer with little light absorption or with a wide band gap such as a-SiC:H, it is preferred to dilute the raw material gas 2 to 100 times with hydrogen gas and to introduce a relatively high microwave power.

[Microcrystalline i-type Layer]

Microcrystalline silicon used in the stacked photovoltaic element of the present invention is advantageously deposited by RF plasma CVD, VHF plasma CVD or microwave plasma CVD. In particular, the deposition rate of microcrystalline silicon depends on the electro-magnetic wave used, and a higher frequency provides a higher deposition rate for the same energy supplied.

The silicon supplying raw material gas suitable for microcrystalline silicon in the present invention is a silane gas such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$ or $Si_2D_3H_3$.

Also the germanium supplying raw material gas suitable for microcrystalline silicon germanium is $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeH_6$ or $GeD_6$.

In order to form a satisfactory microcrystalline semiconductor, the raw material gas has to be diluted with hydrogen gas, preferably at a dilution rate of 10 times or more. The particularly preferred range of dilution rate is from 10 to 100 times. A smaller dilution rate does not provide microcrystals but amorphous semiconductor. On the other hand, an excessively large dilution rate provides a practical problem because the deposition rate of the microcrystals becomes excessively smaller. Dilution with helium is also possible in addition to dilution with hydrogen.

The substrate temperature for producing the microcrystals suitable for the present invention is within a range of 100 to 500° C. The substrate temperature is desirably set to a relatively high temperature in case the deposition rate is to be increased.

The vacuum level in the chamber for depositing the microcrystals of the present invention is preferably within a range of 1 mTorr to 1 Torr. In particular, a vacuum level of several mTorr is preferred in case of depositing a microcrystalline semiconductor by microwave plasma CVD.

The power supplied to the chamber for depositing the microcrystalline semiconductor of the present invention is preferably within a range of 0.01 to 10 W/cm$^2$. In the relationship between the flow rate of the raw material gas and the supplied power, there is advantageously employed a power limited area in which the deposition rate depends on the supplied power.

Also in the deposition of the microcrystalline semiconductor in the present invention, the distance between the substrate and the power supplying electrode is an important factor. The microcrystalline semiconductor suitable for the present invention can be obtained with the electrode distance within a range of 10 to 50 mm.

The desirable average crystal grain size suitable for the microcrystalline semiconductor in the stacked photovoltaic element of the present invention is within a range of 100 Å to 1000 Å. Also the amorphous semiconductor is contained in the microcrystalline semiconductor such that, in the Raman spectrum, the ratio of a peak concerning crystal phase and a peak concerning amorphous phase is preferably 70% or less.

When the average crystal grain size is smaller than 100 Å, the amorphous phase becomes present in a larger amount at the boundary of crystals to cause photodeterioration. Also, when a crystal grain size is small, the mobility or life of electrons and positive holes decrease to deteriorate the characteristics as a semiconductor. On the other hand, when the average crystal grain size exceeds 1000 Å, the relaxation of the crystal boundary, thereby generating defects such as dangling bonds at the crystal boundary, and such defects function as the recombination centers for electrons and positive holes, thereby deteriorating the characteristics as a semiconductor.

The suitable shape of the microcrystals is a shape elongated along the charge moving direction. In addition, the desirable content of the hydrogen or halogen atoms in the microcrystals of the present invention is 30% or less.

In the photovoltaic element, the i-type layer is an important layer for generating and transporting carriers in response to the irradiating light. A layer made slightly p-type or n-type can also be employed as the i-type layer (p-type or n-type can be determined by the distribution of specific defects such as tail states).

The i-type layer employed in the stacked photovoltaic element of the present invention can be not only a layer of a semiconductor having a uniform band gap but also a layer containing silicon atoms and germanium atoms in which the band gap smoothly changes in the thickness direction of the i-type layer and the minimum of the band gap is shifted from the middle of the i-type layer toward the interface between the p-type layer and the i-type layer. There can also be employed an i-type layer which is doped with a valence electron controlling material functioning as a donor and a valence electron controlling material functioning as an acceptor.

In particular, a preferred distribution of hydrogen atoms and/or halogen atoms has a larger content of hydrogen atoms and/or halogen atoms at the sides of p-type/i-type interface and n-type/i-type interface, and the content of hydrogen atoms and/or halogen atoms in the vicinity of such interfaces is preferably within a range of 1.1 to 2 times of that in the bulk area. It is furthermore preferable that the content of hydrogen atoms and/or halogen atoms varies corresponding to the content of silicon atoms. The content of hydrogen atoms and/or halogen atoms at a region where the silicon atom content is minimum is preferably within a range of 1 to 10 atomic %, and is preferably within a range of 0.3 to 0.8 times of the maximum content region of hydrogen atoms and/or halogen atoms of the i-type layer.

The content of hydrogen atoms and/or halogen atoms is varied according to the content of silicon atoms. More specifically it is varied corresponding to the band gap, and the content of hydrogen atoms and/or halogen atoms is lowered where the band gap is narrower.

Although the mechanism has not been fully clarified, according to the deposited film forming method of the present invention, in the deposition of an alloy semiconductor containing silicon atoms and germanium atoms, a difference in the ionization rates of silicon atom and germanium atom generates a difference in the electromagnetic energies respectively captured by these atoms. As a result, it is assumed that sufficient relaxation proceeds in the alloy semiconductor even when the content of hydrogen atoms and/or halogen atoms is small, whereby an alloy semiconductor of satisfactory film quality can be deposited.

The optimum thickness of the i-type layer is within a range of 0.7 to 30.0 μm, though it greatly depends on the structure of the photovoltaic element (for example single cell, double cells or triple cells) and the band gap of the i-type layer.

The i-type layer containing silicon atoms or germanium atoms obtained by the deposited film forming method of the present invention shows little tail state at the side of the valence electron band, even when the deposition rate is increased to 5 nm/sec or more. The inclination of the tail state is 60 meV or less, and the concentration of the dangling bonds measured by electron spin resonance (ESR) is $10^{17}$/cm$^3$ or more.

The band gap of the i-type layer is preferably designed so as to widen toward the p-type/i-type interface and n-type/i-type interface. Such design allows to increase the photoelectromotive force and the photocurrent of the photovoltaic element, and to prevent photodeterioration after a long use time.

[Amorphous i-type Layer]

Amorphous silicon in the stacked photovoltaic element of the present invention is advantageously deposited by RF plasma CVD, VHF plasma CVD or microwave plasma CVD. In particular, the deposition rate of amorphous silicon depends on the electromagnetic wave used, and a higher frequency provides a larger deposition rate for the same energy supplied.

The silicon supplying raw material gas suitable for amorphous silicon in the present invention includes a silane gas such as $SiH_4$, $Si_2H_6$, $SiF_4$, $SiHF_3$, $SiH_2F_2$, $SiH_3F$, $SiH_3Cl$, $SiH_2Cl_2$, $SiHCl_3$, $SiCl_4$, $SiD_4$, $SiHD_3$, $SiH_2D_2$, $SiH_3D$, $SiFD_3$, $SiF_2D_2$, $SiD_3H$ or $Si_2D_3H_3$.

Also the germanium supplying raw material gas suitable for amorphous silicon germanium includes $GeH_4$, $GeF_4$, $GeHF_3$, $GeH_2F_2$, $GeH_3F$, $GeHCl_3$, $GeH_2Cl_2$, $GeH_3Cl$, $GeHD_3$, $GeH_2D_2$, $GeH_3D$, $GeH_6$ or $GeD_6$.

In order to form satisfactory amorphous semiconductor, the raw material gas has to be diluted with hydrogen gas, preferably at a dilution rate of 5 times or more. The particularly preferred range of dilution rate is within a range of 5 to 50 times. Dilution with helium is also possible in addition to dilution with hydrogen.

The substrate temperature for producing the amorphous semiconductor suitable for the present invention is within a range of 100 to 500° C. The substrate temperature is desirably set to a relatively high temperature in case the deposition rate is to be increased.

The vacuum level in the chamber for depositing the amorphous semiconductor of the present invention is preferably within a range of 1 mTorr to 1 Torr. In particular, a vacuum level of several mTorr is preferred in case of depositing the amorphous semiconductor by microwave plasma CVD.

The power supplied to the chamber for depositing the amorphous semiconductor of the present invention is preferably within a range of 0.01 to 5 W/cm$^2$. In the relationship between the flow rate of the raw material gas and the supplied power, there is advantageously employed a power limited area in which the deposition rate depends on the supplied power. In case of a high deposition rate of the amorphous semiconductor, the bias is preferably controlled so that the ions can collide with the substrate.

In addition, the content of the hydrogen or halogen atoms in the amorphous semiconductor of the present invention is preferably within a range of 5 to 30%.

In the photovoltaic element, the i-type layer is an important layer for generating and transporting carriers in response to the irradiating light. A layer made slightly p-type or n-type can also be employed as the i-type layer (p-type or n-type can be determined by the distribution of specific defects such as tail states).

The i-type layer employed in the stacked photovoltaic element of the present invention can be not only a layer of a semiconductor having a uniform band gap but also a layer containing silicon atoms and germanium atoms in which the ban gap smoothly changes in the thickness direction of the i-type layer and the minimum of the band gap is shifted from the middle of the i-type layer toward the interface between the p-type layer and the i-type layer. There can also be employed an i-type layer doped with a valence electron controlling material functioning as a donor and with a valence electron controlling material functioning as an acceptor.

In particular, a preferred distribution of hydrogen atoms and/or halogen atoms has a larger content of hydrogen atoms and/or halogen atoms at the sides of interfaces between the p-type layer and the i-type layer and between the n-type layer and the i-type layer, and the content of hydrogen atoms and/or halogen atoms in the vicinity of such interfaces is preferably within a range of 1.1 to 2 times as large as that in the bulk area. It is furthermore preferable that the content of hydrogen atoms and/or halogen atoms varies corresponding to the content of silicon atoms. The content of hydrogen atoms and/or halogen atoms at a region where the silicon atom content is minimum is preferably within a range of 1 to 10 atomic %, and preferably within a range of 0.3 to 0.8 times as large as that of a region where the content of hydrogen atoms and/or halogen atoms is maximum. When hydrogen atoms and halogen atoms are contained at the same time, the content of halogen atoms does not preferably exceed 1/10 of the content of hydrogen atoms.

The content of hydrogen atoms and/or halogen atoms is varied corresponding to the content of silicon atoms. More specifically, it is varied corresponding to the band gap, and the content of hydrogen atoms and/or halogen atoms is lowered where the band gap is narrower.

Although the mechanism has not been fully clarified, according to the deposited film forming method of the present invention generates, in the deposition of an alloy semiconductor containing silicon atoms and germanium atoms, a difference in the ionization rates of silicon atom and germanium atom generates a difference in the electromagnetic energies respectively captured by these atoms. As a result, it is assumed that sufficient relaxation proceeds in the alloy semiconductor even when the content of hydrogen atoms and/or halogen atoms is small, whereby an alloy semiconductor of satisfactory film quality can be deposited.

The optimum thickness of the i-type layer is within a range of 0.05 to 10 μm, though it greatly depends on the structure of the photovoltaic element (for example, single cell, double cells or triple cells) and the band gap of the i-type layer.

The i-type layer containing silicon atoms or germanium atoms obtained by the deposited film forming method of the present invention shows little tail state at the side of the valence electron band, even when the deposition rate is elevated to 5 nm/sec or more. The inclination of the tail state is 60 meV or less, and the concentration of the dangling bonds measured by electron spin resonance (ESR) does not exceed $10^{17}$/cm$^3$.

The band gap of the i-type layer is preferably designated so as to widen toward interface between the p-type layer and the i-type layer and between the n-type layer and the i-type layer. Such design allows to increase the photoelectromotive force and the photocurrent of the photovoltaic element, and to prevent photodeterioration after a long use time.

[Transparent Electrode]

The transparent electrode can be advantageously composed of a conductive oxide such as indium oxide or indium tin oxide (ITO).

The transparent electrode can be most advantageously deposited by sputtering or vacuum evaporation. In case of depositing a transparent electrode consisting of indium oxide on the substrate in a DC magnetron sputtering apparatus, a target can be composed of metallic indium (In), indium oxide ($In_2O_3$), or the like.

Also in case of depositing a transparent electrode consisting of tin indium oxide on the substrate, a target can be composed of metallic tin, metallic indium, a tin-indium alloy, tin oxide, indium oxide or indium tin oxide singly, or in a suitable combination thereof.

In case of deposition by sputtering, the substrate temperature is an important factor and is preferably within a range of 25 to 600° C. As the sputtering gas there can be employed an inert gas such as argon (Ar), neon (Ne), xenon (Xe) or helium (He). In particular, argon gas is most preferred. It is also preferred to add oxygen gas ($O_2$) to the above-mentioned inert gas according to the necessity. Addition of oxygen gas ($O_2$) is essential in case a metal is used as the target.

For achieving effective sputtering with the above-mentioned inert gas, the pressure in the discharge space is preferably within a range of 0.1 to 50 mTorr. Also, as the sputtering power source, a DC or RF power source is suitable, and the electric power during the sputtering is advantageously within a range of 10 to 1000 W.

The deposition rate of the transparent electrode depends on the pressure in the discharge space and the discharge power, and is optimally within a range of 0.01 to 10 nm/sec.

The thickness of the transparent electrode is preferably determined so as to satisfy the condition for antireflection film, and more specifically is preferably within a range of 50 to 300 nm.

In case of depositing the transparent electrode by vacuum evaporation, the evaporation source can be composed of, for example, metallic tin, metallic indium or an indium-tin alloy.

The substrate temperature during the deposition of the transparent electrode is advantageously within a range of 25 to 600° C.

In depositing the transparent electrode, after the interior of the depositing chamber is evacuated to a pressure of $10^{-6}$ Torr or less, it is necessary to introduce oxygen gas ($O_2$) within a pressure range of $5\times10^{-5}$ to $9\times10^{-4}$ Torr. Oxygen in gaseous phase introduced within this pressure range reacts with the metal gasified from the evaporation source, thereby enabling deposition of a satisfactory transparent electrode.

It is also possible to generate plasma by introducing RF electric power in the above-mentioned vacuum state and to effect evaporation by means of such plasma.

The deposition rate of the transparent electrode under the above-mentioned conditions is preferably within a range of 0.01 to 10 nm/sec, because a deposition rate less than 0.01 nm/sec results in a low productivity while a deposition rate exceeding 10 nm/sec results in a coarse film, thereby deteriorating transmittance, electrical conductivity and adhesion.

[Current-collecting Electrode]

In the present invention, when the resistivity of the transparent electrode 102 cannot be sufficiently lowered, according to necessity, the current collecting electrode 101 is provided on a part of the transparent electrode 102 and serves to lower the resistivity of the transparent electrode, thereby reducing the serial resistance of the photovoltaic element.

The current collecting electrode can be composed of, for example, a metal such as gold, silver, copper, aluminum, nickel, iron, chromium, molybdenum, tungsten, titanium, The pattern of the current collecting electrode is formed with a mask, for example, by evaporation, sputtering, plating or printing. The current collecting electrode can also be formed by adhering a wire-shaped metal coated with conductive paste to the transparent electrode.

In case the stacked photovoltaic element of the present invention is used in producing a photovoltaic device of a desired output voltage and an output current, the stacked photovoltaic elements of the present invention are connected in serial or parallel connection, then protective layers are formed on the top and bottom surfaces, and there are mounted, for example, electrodes for taking out the output current. In case of serial connection of the photovoltaic elements of the present invention, there may be incorporated a diode for blocking the reverse current.

In the following, the preferred examples of the present invention are further described with reference to the attached drawings, but the present invention is not limited to these examples.

EXAMPLE 1

The stacked photovoltaic element of this example was produced with the deposited film forming apparatus shown in FIG. 2. Table 5 show the depositing conditions common to the present example and a comparative example. Also, Table 6 shows the difference in the depositing conditions between the present example and the comparative example (depositing time for the i-type layer being varied to change the thickness thereof), and the currents of the constituent elements thus obtained. n1, i1 and p1 are the n-, i- and p-type layers of the bottom element, respectively. n2, i2 and p2 are the n-, i- and p-type layers of the top element respectively.

TABLE 5

| | | Gas | | | | Power density (W/cm$^2$) | | Vacuum degree | Substrate temp. | Thickness |
|---|---|---|---|---|---|---|---|---|---|---|
| | | SiH$_4$ | H$_2$ | PH$_3$(2% H$_2$) | BF$_3$(2% H$_2$) | RF | VHF | mTorr | (° C.) | Å |
| Bottom | n1 | 2 | 48 | 0.5 | | 0.0382 | | 1300 | 225 | 200 |
| | i1 | 25 | 750 | | | | 0.12 | 300 | 250 | * |
| | p1 | 0.025 | 35 | | 1 | 1.15 | | 2000 | 165 | 50 |
| Top | n2 | 2 | 48 | 0.5 | | 0.0382 | | 1300 | 225 | 100 |
| | i2 | 2 | 48 | | | 0.0382 | | 1150 | 200 | * |
| | p2 | 0.025 | 35 | | 1 | 1.15 | | 2000 | 165 | 50 |

TABLE 6

| Sample No. | Jsc of bottom photovaltaic element (mA/cm$^2$) | Jsc of top photovaltaic element (mA/cm$^2$) | Thickness of bottom photovaltic element (Å) | Thickness of top photovaltic element (Å) |
|---|---|---|---|---|
| 1 (Comparative Ex.) | 11.50 | 11.5 | 10000 | 2000 |
| 2 (Comparative Ex.) | 12.50 | 11.5 | 11000 | 1500 |
| 3 (Present invention) | 10.50 | 12.5 | 10000 | 2500 |
| 4 (Present invention) | 11.00 | 14.0 | 13000 | 3000 | cobalt, tantalum, niobium or zirconium, an alloy such as stainless steel, or a conductive paste employing a powdered metal. The current collecting electrode is formed in a comb shape in order to minimize interception of the light entering the semiconductor layer.

Within the entire area of a photovoltaic device, the area of the current collecting electrode is preferably 15% or less, more preferably 10% or less, and most preferably 5% or less.

The photocurrent of each constituent element was calculated from the spectral sensitivity characteristics, which was measured by the spectrometer YQ-250BX manufactured by Nippon Bunko Co., Ltd. The formed photovoltaic element was irradiated with light of a spectrum of AM 1.5 and an intensity of 1 sun, from YSS-150 manufactured by Yamashita Denso Co., Ltd. The photovoltaic element under light irradiation was maintained at a temperature of 50° C., and the light irradiation was conducted for 2000 hours. The characteristics of the photovoltaic element before and after the light irradiation were measured utilizing WXS-130S-20T manufactured by WACOM Co., Ltd. as the light source, and were evaluated with a spectrum of AM 1.5 and an intensity of 1 sun. The obtained results are shown in Table 7.

TABLE 7

| Sample No. | 1 | 2 | 3 | 4 |
|---|---|---|---|---|
| Deterioration ratio (%) | 10 | 12 | 8 | 7 |

Samples Nos. 3 and 4 of the present example showed lower photodeterioration ratio than the samples of the comparative example.

For observing the cross section of the photovoltaic element of the present example, a thin specimen of the cross section was prepared and observed under a transmission electron microscope. The microcrystalline silicon layer constituting the i-type layer of the bottom photovoltaic element showed pillar-shaped crystals extended in the thickness direction of the layer. Also the crystal grain size of the microcrystals averaged over the thickness direction of the layer and the lateral direction of the layer was about 400 Å.

EXAMPLE 2

In this example, the relationship between a crystal grain size of a non-monocrystalline semiconductor and photodeterioration was investigated. The depositing conditions of the photovoltaic elements were the same as those of sample No. 3 of Example 1. The i-type layer of the bottom photovoltaic element was deposited under the conditions shown in Table 8. The crystal grain size of the i-type layer was measured similarly to Example 1, by cutting a sample for cross sectional observation from the photovoltaic element and observed under the transmission electron microscope. Table 8 also shows the average crystal grain size measured under the transmission electron microscope.

Similarly to Example 1, photodeterioration characteristics were measured on 6 photovoltaic elements produced under the conditions shown in Table 8, which also shows the photodeterioration ratio of the samples.

TABLE 8

| Sample No. | $SiH_4$ flow rate (sccm) | $H_2$ dilution ratio | Average crystal grain size (Å) | Degradation ratio (%) |
|---|---|---|---|---|
| 1 | 50 | 1 | amorphous | 15 |
| 2 | 50 | 2 | 50 | 10 |
| 3 | 50 | 10 | 100 | 8 |
| 4 | 50 | 20 | 200 | 8 |
| 5 | 50 | 30 | 300 | 8 |
| 6 | 50 | 90 | 500 | 8 |
| 7 | 50 | 100 | 1000 | 8 |

TABLE 8-continued

| Sample No. | $SiH_4$ flow rate (sccm) | $H_2$ dilution ratio | Average crystal grain size (Å) | Degradation ratio (%) |
|---|---|---|---|---|
| 8 | 50 | 100 | 2000 (annealed) | low initial characteristics |

A satisfactory degradation ratio was obtained when the crystal grain size is within a range of 100 Å to 1000 Å suitable for the stacked photovoltaic element of the present invention. Also the initial characteristics were low in the photovoltaic element (sample No. 8) by using the crystal grain size increased by laser annealing.

As explained in the foregoing, the present invention provides a stacked photovoltaic element having a high photoelectric conversion efficiency and a reduced variation of the photoelectric conversion efficiency under a long light irradiation time by employing a microcrystalline semiconductor in the i-type layer of the first pin junction constituent element and an amorphous semiconductor in the i-type layer of the second pin junction constituent element.

What is claimed is:

1. A stacked photovalic element comprising a pin junction constituent element having a microcrystalline semiconductor layer in an i-type semiconductor layer and a pin junction constituent element having an amorphous semiconductor in an i-type semiconductor layer, the pin junction constituent elements being stacked on a supporting member, wherein a current is controlled by the pin junction constituent element having the microcrystalline semiconductor in the i-type semiconductor layer, and wherein microcrystals comprising the microcrystalline semiconductor have a columnar structure with a shape elongated along a charge moving direction.

2. The stacked photovoltaic element according to claim 1, wherein a short circuit current of the pin junction constituent element having the microcrystalline semiconductor in the i-type semiconductor layer is set to a value smaller than a value of a short circuit current of the pin junction constituent element having the amorphous semiconductor in the i-type semiconductor layer.

3. The stacked photovoltaic element according to claim 1, wherein an average crystal grain size of the i-type semiconductor layer of the microcrystalline semiconductor is within a range from 100 Å to 1000 Å.

4. The stacked photovoltaic element according to claim 1, wherein the band gap of the i-type semiconductor layer of the microcrystalline semiconductor is set so as to become wider toward an interface between a p-type semiconductor layer and the i-type semiconductor layer and toward an interface between an n-type semiconductor layer and the i-type semiconductor layer.

* * * * *

UNITED STATES PATENT AND TRADEMARK OFFICE
CERTIFICATE OF CORRECTION

PATENT NO.    : 6,483,021 B2
DATED         : November 19, 2002
INVENTOR(S)   : Keishi Saito It is certified that error appears in the above-identified patent and that said Letters Patent is hereby corrected as shown below:

Column 6,
Line 53, "gasses" should read -- gases --.

Column 9,
Line 66, "$SbCl_1$," should read -- $SbCl_5$, --

Column 18,
Line 26, "photovalic" should read -- photovoltaic --; and
Line 28, "layer" (first occurrence) should be deleted.

Signed and Sealed this

Nineteenth Day of August, 2003

JAMES E. ROGAN
*Director of the United States Patent and Trademark Office*